US012749545B2

(12) United States Patent
Choi

(10) Patent No.: US 12,749,545 B2
(45) **Date of Patent: *Sep. 29, 2026**

(54) SEMICONDUCTOR MEMORY DEVICE AND OPERATING METHOD THEREOF

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 84 days.

This patent is subject to a terminal disclaimer.

(21) Appl. No.: 18/778,391

(22) Filed: Jul. 19, 2024

(65) Prior Publication Data

US 2024/0371451 A1 Nov. 7, 2024

Related U.S. Application Data

(63) Continuation of application No. 17/566,306, filed on Dec. 30, 2021, now Pat. No. 12,068,045.

(30) Foreign Application Priority Data

Aug. 17, 2021 (KR) ........................ 10-2021-0108067

(51) Int. Cl.

| | |
|---|---|
| ***G11C 16/10*** | (2006.01) |
| ***G11C 16/04*** | (2006.01) |
| ***G11C 16/08*** | (2006.01) |
| ***G11C 16/14*** | (2006.01) |
| ***G11C 16/26*** | (2006.01) |
| ***G11C 16/30*** | (2006.01) |
| ***G11C 16/34*** | (2006.01) |

(52) U.S. Cl.

CPC ...... *G11C 16/3459* (2013.01); *G11C 16/0433* (2013.01); *G11C 16/08* (2013.01); *G11C 16/102* (2013.01); *G11C 16/14* (2013.01); *G11C 16/26* (2013.01); *G11C 16/30* (2013.01); *G11C 16/3445* (2013.01)

(58) Field of Classification Search

CPC . G11C 16/3459; G11C 16/0433; G11C 16/08; G11C 16/102; G11C 11/14; G11C 11/26; G11C 11/30

See application file for complete search history.

(56) References Cited

U.S. PATENT DOCUMENTS

| | | | | |
|---|---|---|---|---|
| 7,342,830 | B1 | 3/2008 | Chen et al. | |
| 10,978,153 | B1 | 4/2021 | Liu et al. | |
| 11,037,635 | B1 * | 6/2021 | Lien | G11C 16/10 |
| 12,068,045 | B2 * | 8/2024 | Choi | G11C 16/3459 |
| 2009/0031075 | A1 | 1/2009 | Kim | |

(Continued)

FOREIGN PATENT DOCUMENTS

| | | | |
|---|---|---|---|
| KR | 101076879 | B1 | 10/2011 |
| KR | 101552210 | B1 | 9/2015 |

(Continued)

*Primary Examiner* — Min Huang

(74) *Attorney, Agent, or Firm* — WILLIAM PARK AND ASSOCIATES LTD.

(57) ABSTRACT

A semiconductor memory device includes a memory cell array circuit and a driving force adjustment circuit. The memory cell array circuit includes a plurality of memory cells. The driving force adjustment circuit adjusts driving forces of a plurality of respective verify pass voltages based on whether or not the plurality of memory cells are programmed.

16 Claims, 5 Drawing Sheets

(56) References Cited

U.S. PATENT DOCUMENTS

| | | | |
|---|---|---|---|
| 2018/0068740 | A1 | 3/2018 | Lee |
| 2018/0336949 | A1 | 11/2018 | Choi et al. |
| 2022/0076752 | A1 | 3/2022 | Wu et al. |

FOREIGN PATENT DOCUMENTS

| | | | |
|---|---|---|---|
| KR | 1020160028076 | A | 3/2016 |
| KR | 101805229 | B1 | 12/2017 |
| KR | 1020180080838 | A | 7/2018 |
| KR | 1020190029283 | A | 3/2019 |
| KR | 101984796 | B1 | 6/2019 |
| KR | 1020190120502 | A | 10/2019 |

* cited by examiner

SEMICONDUCTOR MEMORY DEVICE AND OPERATING METHOD THEREOF

CROSS-REFERENCES TO RELATED APPLICATION

The present application is a continuation application of U.S. patent application Ser. No. 17/566,306, filed on Dec. 30, 2021, which claims priority under 35 U.S.C. § 119 (a) to Korean application number 10-2021-0108067, filed on Aug. 17, 2021, in the Korean Intellectual Property Office, which applications are incorporated herein by reference in their entirety.

BACKGROUND

1. Technical Field

Various embodiments generally relate to a semiconductor memory device and an operating method thereof, and more particularly, to a semiconductor memory device which can perform a verify operation by applying a verify pass voltage to a plurality of word lines, and an operating method thereof.

2. Related Art

In general, a semiconductor memory device is divided into a volatile memory device and a nonvolatile memory device. The volatile memory device and the nonvolatile memory device are capable of performing a data processing operation of storing data or outputting stored data using power applied thereto. The volatile memory device has the advantage of fast data processing speed, but has the disadvantage of with to be continuously supplied with power in order to maintain stored data. The nonvolatile memory device has the advantage of not requiring power to be continuously supplied to maintain the stored data, but has the disadvantage of slow data processing speed.

These days, as the process and design technologies for the semiconductor memory device are remarkably developed, the difference between the data processing speed of the volatile memory device and the data processing speed of the nonvolatile memory device have been significantly reduced. Therefore, recently, the nonvolatile memory device has been spotlighted.

A representative example of the nonvolatile memory device is a NAND type flash memory device with a string structure in which a plurality of memory cells are coupled in series. Each memory cell of the NAND type flash memory device includes a floating gate. Accordingly, the memory cell may store logic 'high' data or logic 'low' data by introducing or discharging electrons into or from the floating gate through the Fowler-Nordheim tunneling method.

The nonvolatile memory device including the NAND type flash memory device performs a program operation in order to store data in a memory cell and performs a read operation in order to output data that is stored in a memory cell. Furthermore, the nonvolatile memory device performs an erase operation in order to erase data, stored in a memory cell, prior to the program operation. Each of the program operation, the read operation, and the erase operation involves a verify operation. The verify operation is an operation that verifies whether desired data is accurately stored in a memory cell according to the program operation, the read operation, and the erase operation.

Each memory cell of the nonvolatile memory device is defined as a single level cell, a multi-level cell, a triple level cell, or a quadruple level cell based on the number of distributions of data that is stored in one memory cell in a program operation. The single level cell stores two logic data that corresponds to one bit, the multi-level cell stores four logic data that corresponds to two bits, the triple level cell stores eight logic data that corresponds to three bits, and the quadruple level cell stores sixteen logic data that corresponds to four bits.

Recently, memory cells are being developed in a direction in which the number of distributions of data that is stored therein increases. The fact that the number of distributions of data that is stored in memory cells gradually increases means that it is necessary to precisely distinguish the distributions of data. An operation related therewith is a verify operation of a semiconductor memory device.

The semiconductor memory device spends a relatively large amount of time for the verify operation. Thus, as the number of distributions of data that is stored in each memory cell gradually increases, an operation time for the verify operation gradually increases. In addition, the semiconductor memory device consumes a relatively large amount of power for the verify operation. Thus, as the number of distributions of data that is stored in each memory cell gradually increases, power consumption in the verify operation gradually increases.

SUMMARY

In an embodiment, a semiconductor memory device may include: a memory cell array circuit including a plurality of memory cells that are coupled to a plurality of word lines; and a driving force adjustment circuit configured to adjust driving forces of a plurality of respective verify pass voltages that are applied to the plurality of word lines based on whether or not at least one memory cell, among the plurality of memory cells, is programmed.

In an embodiment, a method for operating a semiconductor memory device may include: obtaining a verify operation information; setting driving forces of a plurality of respective verify pass voltages based on the verify operation information; driving a selected word line, among a plurality of word lines, corresponding to a verify target memory cell, by a verify voltage, and driving unselected word lines, among the plurality of word lines, by the plurality of verify pass voltages; and performing a verify operation on the verify target memory cell.

DETAILED DESCRIPTION

Figure 1:
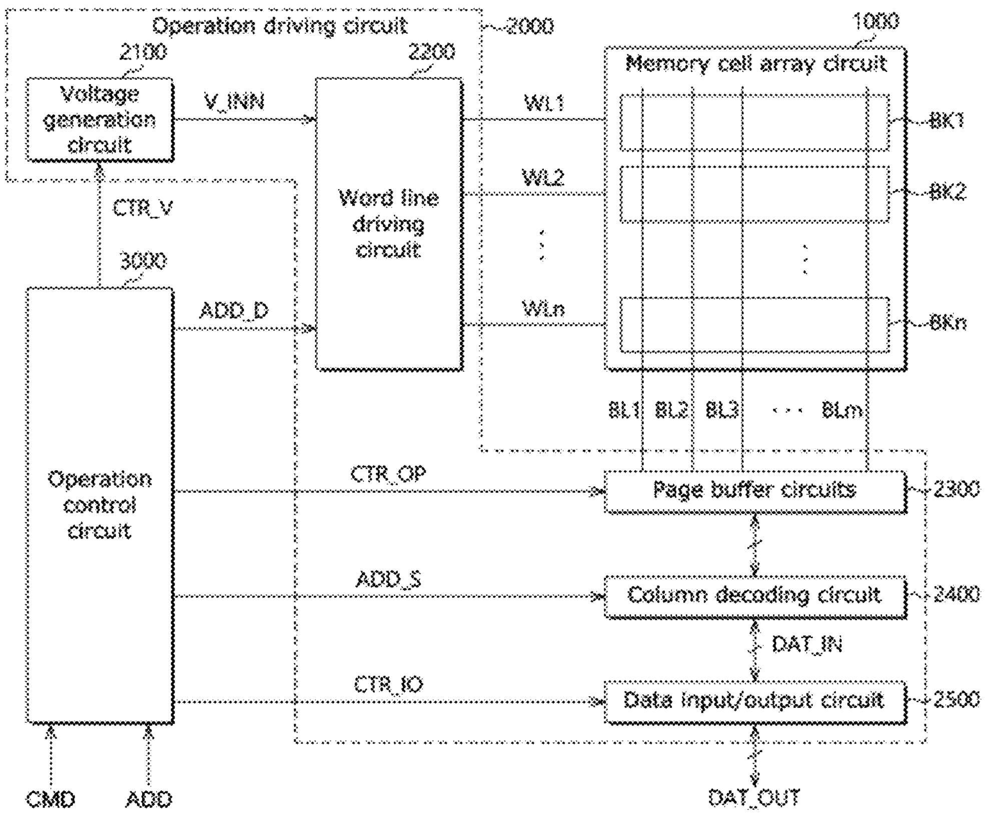
FIG. 1 is a block diagram illustrating a configuration of a semiconductor memory device in accordance with an embodiment of the present disclosure.

The description of the present disclosure is an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the “first” and the “second,” are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as “include” or “have,” should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe an order of the steps. The steps may be performed in an order different from the order described in the context unless a specific order is clearly described in the context. That is, the steps may be performed based on a described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Hereinafter, a semiconductor memory device and an operating method thereof will be described below with reference to the accompanying drawings through various examples of embodiments.

Various embodiments are directed to a semiconductor memory device which can perform a verify operation by adjusting driving forces of a plurality of verify pass voltages that are applied to a plurality of word lines based on whether or not a plurality of memory cells are programmed, and an operating method thereof.

FIG. 1 is a block diagram illustrating a configuration of a semiconductor memory device in accordance with an embodiment of the present disclosure.

Referring to FIG. 1, the semiconductor memory device may include a memory cell array circuit 1000, an operation driving circuit 2000, and an operation control circuit 3000.

The memory cell array circuit 1000 may be a component for storing data. The memory cell array circuit 1000 may include a plurality of memory block circuits BK1 to BKn (n is a natural number). Each of the plurality of memory block circuits BK1 to BKn may include a plurality of memory cells for storing data. The plurality of memory cells may have a string structure in which the plurality of memory cells are coupled in series in the vertical direction of the drawing. The plurality of memory cells may be coupled to a plurality of word lines WL1 to WLn and a plurality of bit lines BL1 to BLm (m is a natural number), respectively, to have a matrix structure. As will be described later again, the plurality of word lines WL1 to WLn may be driven to preset voltages by the word line driving circuit 2200 according to a program operation, a read operation, an erase operation, and a verify operation. The plurality of bit lines BL1 to BLm may be driven to preset voltages based on data that is stored in the memory cells or data to be stored in the memory cells.

The operation driving circuit 2000 may be a component that is driven to perform the program operation, the read operation, the erase operation, and the verify operation on target memory cells of the memory cell array circuit 1000. The operation driving circuit 2000 may include a voltage generation circuit 2100, a word line driving circuit 2200, a plurality of page buffer circuits 2300, a column decoding circuit 2400, and a data input/output circuit 2500. Hereinafter, each component that is included in the operation driving circuit 2000 will be described.

The voltage generation circuit 2100 may be a component for generating an internal voltage V_INN that is required for each of the program operation, the read operation, the erase operation, and the verify operation. The voltage generation circuit 2100 may generate the internal voltage V_INN of various voltage levels, corresponding to each operation, based on a voltage control signal CTR_V, which is generated by the operation control circuit 3000.

The word line driving circuit 2200 may be a component for selectively applying the internal voltage V_INN, generated by the voltage generation circuit 2100, to the plurality of word lines WL1 to WLn. The word line driving circuit 2200 may be applied with the internal voltage V_INN from the voltage generation circuit 2100 and may be applied with a driving address signal ADD_D from the operation control circuit 3000. The driving address signal ADD_D may be a signal for selectively activating a corresponding word line, among the plurality of word lines WL1 to WLn. Accordingly, the word line driving circuit 2200 may activate each of the plurality of word lines WL1 to WLn based on the driving address signal ADD_D and the internal voltage V_INN, and the word line driving circuit 2200 may drive the activated word line to the corresponding internal voltage V_INN.

Although not illustrated in the drawing, the word line driving circuit 2200 may also be coupled to a drain select line, a source select line, and a common source line that are included in the memory cell array circuit 1000. Accordingly, the word line driving circuit 2200 may apply the preset internal voltage V_INN to each of the drain select line, the source select line, and the common source line according to the program operation, the read operation, the erase operation, and the verify operation.

For example, in the program operation, the word line driving circuit 2200 may apply a program voltage as one of internal voltages V_INN to a word line that is selected among the plurality of word lines WL1 to WLn and may apply a program pass voltage with a voltage level that is lower than the program voltage to the remaining unselected word lines. In the read operation, the word line driving circuit 2200 may apply a read voltage to a selected word line and may apply a read pass voltage with a voltage level that is higher than the read voltage to unselected word lines. In the erase operation, the word line driving circuit 2200 may apply a ground voltage to a selected word line. In the verify operation, the word line driving circuit 2200 may apply a verify voltage as one of the internal voltages V_INN to a selected word line and may apply a plurality of verify pass voltages with voltage levels that are higher than the verify voltage to unselected word lines. The plurality of verify pass voltages that are applied in the verify operation will be described later in more detail.

The plurality of page buffer circuits 2300 may be coupled to the memory cell array circuit 1000 through the plurality of bit lines BL1 to BLm. The plurality of page buffer circuits 2300 may be components for transferring data to the plurality of bit lines BL1 to BLm in the program operation. The plurality of page buffer circuits 2300 may be components for receiving data from the plurality of bit lines BL1 to BLm in the read operation and the verify operation. Each of the plurality of page buffer circuits 2300 may be configured by a plurality of latch circuits. Each latch circuit may perform the program operation, the read operation, and the verify operation on data to be input and output, based on an operation control signal CTR_OP, which is generated by the operation control circuit 3000.

The column decoding circuit 2400 may be a component for controlling the transfer path of data to be input and output. The column decoding circuit 2400 may be applied with data to be output to an external device, from the plurality of page buffer circuits 2300, and may be applied with data to be input to an internal circuit, from the data input/output circuit 2500. The column decoding circuit 2400 may control the transfer path of data to be input and output, by being applied with a select address signal ADD_S from the operation control circuit 3000. The select address signal ADD_S may be a signal for selecting a corresponding bit line, among the plurality of bit lines BL1 to BLm.

The data input/output circuit 2500 may be a component for controlling the input and output of external data DAT_OUT and internal data DAT_IN. The data input/output circuit 2500 may perform an input/output operation of data based on an input/output control signal CTR_IO that is generated by the operation control circuit 3000. The data input/output circuit 2500 may output the external data DAT_OUT, input from an external device, as the internal data DAT_IN, in the program operation based on the input/output control signal CTR_IO. The data input/output circuit 2500 may output the internal data DAT_IN, input from the column decoding circuit 2400, as the external data DAT_OUT, in the read operation based on the input/output control signal CTR_IO.

The operation control circuit 3000 may be a component for controlling the voltage generation circuit 2100, the word line driving circuit 2200, the plurality of page buffer circuits 2300, the column decoding circuit 2400, and the data input/output circuit 2500, which are included in the operation driving circuit 2000. The operation control circuit 3000 may generate the voltage control signal CTR_V for controlling the voltage generation circuit 2100 based on a command signal CMD and an address signal ADD from an external device. The operation control circuit 3000 may generate the driving address signal ADD_D to be provided to the word line driving circuit 2200. The operation control circuit 3000 may generate the operation control signal CTR_OP for controlling the plurality of page buffer circuits 2300. The operation control circuit 3000 may generate the select address signal ADD_S for controlling the column decoding circuit 2400. The operation control circuit 3000 may generate the input/output control signal CTR_IO for controlling the data input/output circuit 2500. The operation control circuit 3000 may control the overall operation of the semiconductor memory device. That is to say, the semiconductor memory device may perform the program operation, the read operation, the erase operation, and the verify operation by the operation control circuit 3000.

Figure 2:
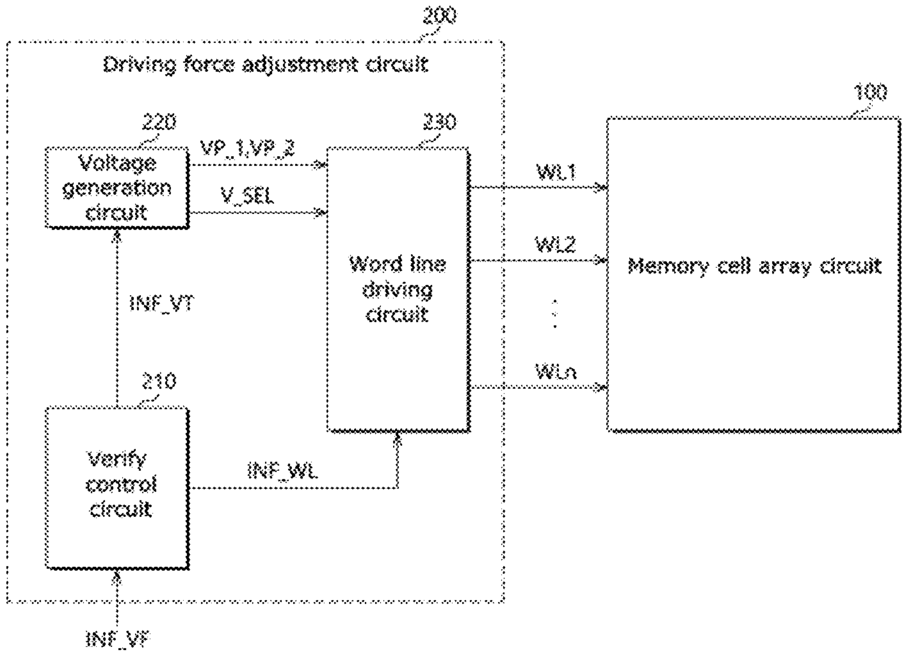
FIG. 2 is a block diagram illustrating a partial configuration of a semiconductor memory device in accordance with an embodiment of the present disclosure.

FIG. 2 is a block diagram illustrating a partial configuration of a semiconductor memory device in accordance with an embodiment of the present disclosure.

Referring to FIG. 2, the semiconductor memory device may include a memory cell array circuit 100, and a driving force adjustment circuit 200.

The memory cell array circuit 100 may be a component for including a plurality of memory cells that are coupled to a plurality of word lines WL1, WL2, . . . WLn. The plurality of memory cells may have a string structure in which the plurality of memory cells are coupled in series. The memory cell array circuit 100 may be a component that corresponds to the memory cell array circuit 1000 of FIG. 1.

The driving force adjustment circuit 200 may be a component for adjusting the driving force of each of a plurality of verify pass voltages VP_1 and VP_2 that are applied to the plurality of word lines WL1, WL2, . . . WLn based on whether or not at least one memory cell, among the plurality of memory cells, is programmed. As will be described later again, the plurality of verify pass voltages VP_1 and VP_2 may include a first verify pass voltage VP_1 and a second verify pass voltage VP_2 that have different driving forces.

Hereinafter, the schematic operation of the driving force adjustment circuit 200 will be described with reference to FIG. 3.

Figure 3:
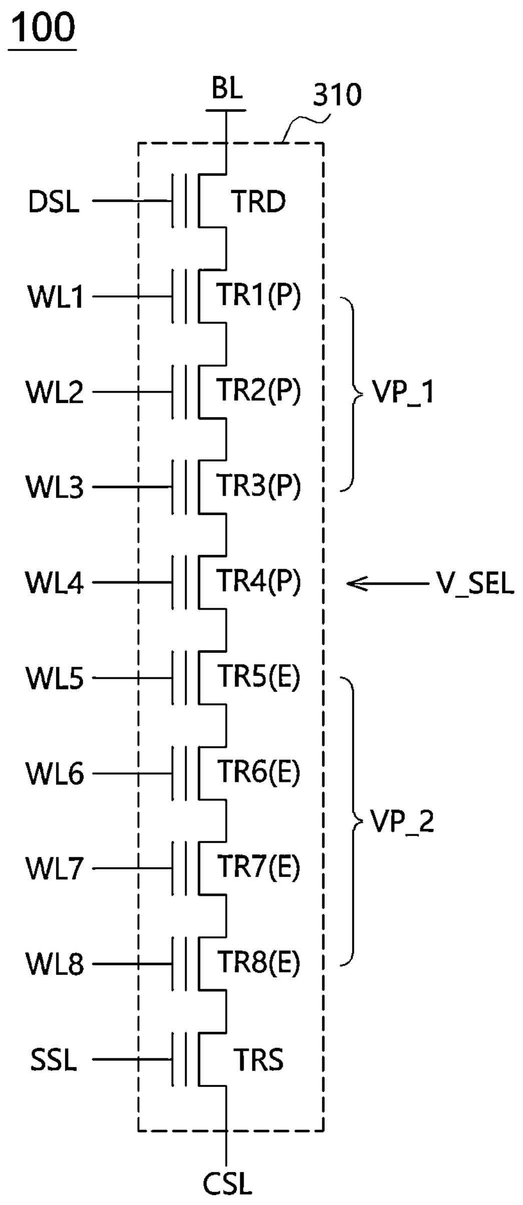
FIG. 3 is a schematic diagram for showing a schematic operation of a driving force adjustment circuit of FIG. 2.

FIG. 3 is a schematic diagram for showing the schematic operation of the driving force adjustment circuit 200 of FIG. 2. For the sake of convenience in explanation, a plurality of memory cells 310 as a part of the memory cell array circuit 100 of FIG. 2 are illustrated. Further, for the sake of convenience in explanation, the plurality of memory cells 310 may include eight memory cells. Each of the eight memory cells may be configured as a cell transistor to be described below.

Referring to FIG. 3, the plurality of memory cells 310 may include a drain transistor TRD that is coupled to a bit line BL and a drain select line DSL, and a source transistor TRS that is coupled to a common source line CSL and a source select line SSL. The plurality of memory cells 310 may include first to eighth cell transistors TR1, TR2, . . . TR8 that are coupled in series between the drain transistor TRD and the source transistor TRS, and thus, the plurality of memory cells 310 may have a string structure.

The first to eighth cell transistors TR1, TR2, . . . TR8 may be coupled to the first to eighth word lines WL1, WL2, . . . WL8, respectively. In the verify operation, the driving force adjustment circuit 200 of FIG. 2 may apply the first and second verify pass voltages VP_1 and VP_2 as the plurality of verify pass voltages VP_1 and VP_2 to unselected word lines, among the first to eighth word lines WL1, WL2, . . . WL8. For reference, in the verify operation, data that is stored in a verify target memory cell may be transferred to the plurality of page buffer circuits 2300 (see FIG. 1) through the bit line BL.

Hereinafter, for the sake of convenience in explanation, it is assumed that the first to fourth cell transistors TR1, TR2, TR3, and TR4 are in a programmed state (P) and the fifth to eighth cell transistors TR5, TR6, TR7, and TR8 are in an erased state (E). Also, it is assumed that the verify target memory cell is the fourth cell transistor TR4.

In the verify operation for the fourth cell transistor TR4, the driving force adjustment circuit 200 of FIG. 2 may apply a verify voltage V_SEL to the fourth word line WL4 that corresponds to the fourth cell transistor TR4. In other words, the fourth word line WL4, being a word line that is selected among the first to eighth word lines WL1, WL2, . . . WL8, may be driven by the verify voltage V_SEL.

The driving force adjustment circuit 200 may apply the first and second verify pass voltages VP_1 and VP_2 to unselected word lines, among the first to eighth word lines WL1, WL2, . . . WL8. In more detail, the driving force adjustment circuit 200 may apply the first verify pass voltage VP_1 to the first to third word lines WL1, WL2, and WL3 that correspond to the first to third cell transistors TR1, TR2, and TR3 that are in the programmed state (P). The driving force adjustment circuit 200 may apply the second verify pass voltage VP_2 to the fifth to eighth word lines WL5, WL6, WL7, and WL8 that correspond to the fifth to eighth cell transistors TR5, TR6, TR7, and TR8 that are in the erased state (E). Namely, the first to third word lines WL1, WL2, and WL3 that are unselected word lines, among the first to eighth word lines WL1, WL2, . . . WL8, may be driven by the first verify pass voltage VP_1. The fifth to eighth word lines WL5, WL6, WL7, and WL8 which are unselected word lines, among the first to eighth word lines WL1, WL2, . . . WL8, may be driven by the second verify pass voltage VP_2. The first verify pass voltage VP_1 and the second verify pass voltage VP_2 may have different driving forces.

As a result, in the verify operation, the driving force adjustment circuit 200 may apply the verify voltage V_SEL to a selected word line. In the verify operation, the driving force adjustment circuit 200 may apply the first and second verify pass voltages VP_1 and VP_2 with different driving forces to unselected word lines.

The semiconductor memory device, in accordance with the embodiment of the present disclosure, may perform the verify operation by using the first verify pass voltage VP_1 and the second verify pass voltage VP_2, the first verify pass voltage VP_1 and the second verify pass voltage VP_2 having different driving forces.

As described above, the driving force of the first verify pass voltage VP_1 and the driving force of the second verify pass voltage VP_2 may be different. The driving force of each of the first verify pass voltage VP_1 and the second verify pass voltage VP_2 may be changed based on whether or not a memory cell is programmed. This will be described below in more detail with reference to FIG. 4.

Figure 4:
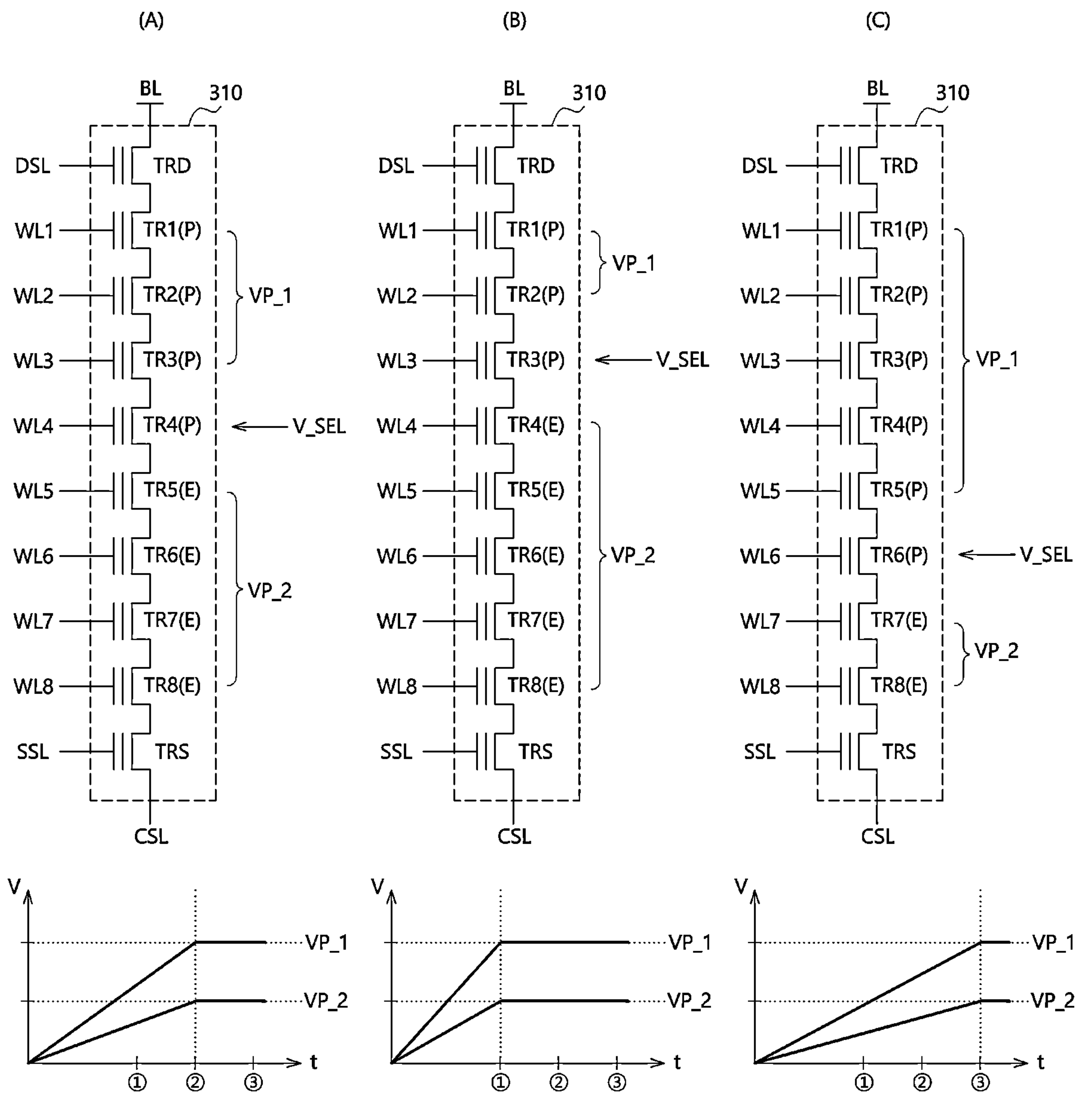
FIG. 4 is a schematic diagram illustrating various examples in relation with FIG. 3.

FIG. 4 is a schematic diagram illustrating various examples in relation with FIG. 3.

FIG. 4 illustrates a case (A) that corresponds to FIG. 3 and illustrates a case (B) and a case (C) as examples that are different from case (A). In case (A), as described above with reference to FIG. 3, the first and second verify pass voltages VP_1 and VP_2 may be applied to unselected word lines to verify the fourth cell transistor TR4. In case (B), the first and second verify pass voltages VP_1 and VP_2 may be applied to unselected word lines to verify the third cell transistor TR3. In case (C), the first and second verify pass voltages VP_1 and VP_2 may be applied to unselected word lines to verify the sixth cell transistor TR6.

Case (A) may be a verify operation for the fourth cell transistor TR4.

In case (A), the first verify pass voltage VP_1 and the second verify pass voltage VP_2 may have different driving forces. Namely, the slopes of the first verify pass voltage VP_1 and the second verify pass voltage VP_2 may be different. The target voltage levels of the first verify pass voltage VP_1 and the second verify pass voltage VP_2 may be different. The target voltage level of the first verify pass voltage VP_1 may be higher than the target voltage level of the second verify pass voltage VP_2. For example, the target voltage level of the first verify pass voltage VP_1 may be 5.5 [V] to 7 [V]. The target voltage level of the second verify pass voltage VP_2 may be 2 [V] to 4 [V]. These target voltage levels represent one example, and the present disclosure is not limited thereto.

As can be seen from the drawing, in case (A), the respective first verify pass voltage VP_1 and second verify pass voltage VP_2 may be driven to the target voltage levels at time point 2. Therefore, the plurality of page buffer circuits 2300 of FIG. 1 may perform the verify operation by being activated at time point 2.

Case (B) may be a verify operation for the third cell transistor TR3.

Even in case (B), the first verify pass voltage VP_1 and the second verify pass voltage VP_2 may have different driving forces. The target voltage levels of the first verify pass voltage VP_1 and the second verify pass voltage VP_2 may be different. In case (B), the target voltage level of the first verify pass voltage VP_1 may be the same as the target voltage level of the first verify pass voltage VP_1 in case (A). In case (B), the target voltage level of the second verify pass voltage VP_2 may be the same as the target voltage level of the second verify pass voltage VP_2 in case (A).

As can be seen from the drawing, in case (B), the first verify pass voltage VP_1 and the second verify pass voltage VP_2 may be driven to the target voltage levels at time point 1. Therefore, the plurality of page buffer circuits 2300 of FIG. 1 may perform the verify operation by being activated at time point (1).

Case (C) may be a verify operation for the sixth cell transistor TR6.

Even in case (C), the first verify pass voltage VP_1 and the second verify pass voltage VP_2 may have different driving forces. In case (C), the target voltage levels of the respective first and second verify pass voltages VP_1 and VP_2 may be the same as the target voltage levels of the respective first and second verify pass voltages VP_1 and VP_2 in case (A) and case (B).

As can be seen from the drawing, in case (C), the first verify pass voltage VP_1 and the second verify pass voltage VP_2 may be driven to the target voltage levels at time point 3. Therefore, the plurality of page buffer circuits 2300 of FIG. 1 may perform the verify operation by being activated at time point 33.

As can be seen from FIG. 4, the first verify pass voltage VP_1 may be applied to memory cells that are in the programmed state (P), and the second verify pass voltage VP_2 may be applied to memory cells that are in the erased state (E). The driving force of the second verify pass voltage VP_2 that is applied to the memory cells that are in the erased state (E) may be reduced as compared to the driving force of the first verify pass voltage VP_1 that is applied to the memory cells which are in the programmed state (P).

Through this operation, the semiconductor memory device, in accordance with the embodiment of the present disclosure, may adjust the driving forces of the respective first and second verify pass voltages VP_1 and VP_2 based on whether or not at least one memory cell, among the plurality of memory cells 310, is programmed. Thus, the semiconductor memory device may minimize power to be consumed in the verify operation.

In this regard, in each of the cases (A), (B), and (C), the number of memory cells, among the plurality of memory cells 310, in the programmed state (P) and the number of memory cells, among the plurality of memory cells 310, in the erased state (E) may be different. That is to say, in case (A), among the plurality of memory cells 310, the number of memory cells in the programmed state (P) may be four, and the number of memory cells in the erased state (E) may be four. In case (B), among the plurality of memory cells 310, the number of memory cells in the programmed state (P) may be three, and the number of memory cells in the erased state (E) may be five. In case (C), among the plurality of memory cells 310, the number of memory cells in the programmed state (P) may be six, and the number of memory cells in the erased state (E) may be two. In summary, the respective first and second verify pass voltages VP_1 and VP_2 may have driving forces that correspond to the number of memory cells, among the plurality of memory cells 310, in the programmed state (P) and the number of memory cells, among the plurality of memory cells 310, in the erased state (E).

In case (A), the plurality of page buffer circuits 2300 (see FIG. 1) may be activated at time point 2. In case (B), the plurality of page buffer circuits 2300 may be activated at time point (1). In case (C), the plurality of page buffer circuits 2300 may be activated at time point 3. In other words, when the number of memory cells in the programmed state (P) is smaller and the number of memory cells in the erased state (E) is larger, that is, in case (B), the activation time point of the plurality of page buffer circuits 2300 may be earlier than those of case (A) and case (C).

In summary, the driving force adjustment circuit 200 (see FIG. 2) may adjust the time points ①, ②, and ③ based on the number of memory cells, among the plurality of memory cells 310, in the programmed state (P) and the number of memory cells, among the plurality of memory cells 310, in the erased state (E). The semiconductor memory device may adjust the activation time point of the plurality of page buffer circuits 2300 (see FIG. 1) based on the time points ①, ②, and ③. For reference, the activation time point of the plurality of page buffer circuits 2300 may be controlled by the operation control circuit 3000. Therefore, the semiconductor memory device may optimize an operation time for the verify operation.

The semiconductor memory device may set a program direction. The program direction may be defined as order in which data is programmed to a plurality of memory cells. Referring to FIG. 3 again, for example, the program operation may be performed in a direction from the drain transistor TRD to the source transistor TRS, among the plurality of memory cells 310. Alternatively, for example, the program operation may be performed in a direction from the source transistor TRS to the drain transistor TRD, among the plurality of memory cells 310. The plurality of memory cells 310 of FIG. 3 may be a result of performing the program operation in the direction from the drain transistor TRD to the source transistor TRS. That is to say, among the plurality of memory cells 310, the first cell transistor TR1 may be programmed, and, thereafter, based on the program direction, the second cell transistor TR2 and the third cell transistor TR3 may be sequentially programmed.

Thus, the driving force adjustment circuit 230 may apply the first and second verify pass voltages VP_1 and VP_2 to unselected word lines based on the location of a verify target memory cell. In other words, the driving force adjustment circuit 230 may apply the first verify pass voltage VP_1 and the second verify pass voltage VP_2 to unselected word lines based on the location of a verify target memory cell and the program direction. Namely, each of the first and second verify pass voltages VP_1 and VP_2 may have a driving force that corresponds to the location of a verify target memory cell and a program direction.

In summary, the driving force adjustment circuit 200 (see FIG. 2) may adjust the time points ①, ②, and ③ based on the location of a verify target memory cell and a program direction. The semiconductor memory device may adjust the activation time point of the plurality of page buffer circuits 2300 (see FIG. 1) based on the time points ①, ②, and ③. Therefore, the semiconductor memory device may optimize an operation time for the verify operation.

FIG. 4 illustrates, as an example, that the plurality of page buffer circuits 2300 (see FIG. 1) are activated at time points ①, ②, and ③, but the semiconductor memory device in accordance with the embodiment of the present disclosure is not limited thereto. That is to say, the driving force adjustment circuit 200 (see FIG. 2) may increase a driving force in case (A) and further increase a driving force in case (C), based on case (B). Therefore, the plurality of page buffer circuits 2300 may be activated at the same time point in all of the cases (A), (B), and (C).

The more detailed configuration of the driving force adjustment circuit 200 will be described below with reference to FIG. 2 again. The driving force adjustment circuit 200 may include a verify control circuit 210, a voltage generation circuit 220, and a word line driving circuit 230. The verify control circuit 210, the voltage generation circuit 220, and the word line driving circuit 230 may be included as partial components of the operation control circuit 3000, the voltage generation circuit 2100, and the word line driving circuit 2200, respectively, of FIG. 1.

The verify control circuit 210 may be a component for generating a selection voltage information INF_VT and a selection word line information INF_WL based on a verify operation information INF_VF that corresponds to whether or not the program operation is performed. The verify operation information INF_VF may be generated based on the external command signal CMD in the operation control circuit 3000 of FIG. 1 or may be internally generated after the program operation.

The verify operation information INF_VF may include, besides information regarding whether or not the program operation is performed, a flag information for entering the verify operation and information regarding the location of a verify target memory cell. In addition, the verify operation information INF_VF may include information regarding the number of memory cells in the programmed state (P) and information regarding the number of memory cells in the erased state (E) among the plurality of memory cells 310. Accordingly, the driving force adjustment circuit 200 of FIG. 2 may adjust the driving forces of the respective first and second verify pass voltages VP_1 and VP_2 based on the number of memory cells in the programmed state (P) and the number of memory cells in the erased state (E), among the plurality of memory cells 310. Further, the verify operation information INF_VF may include information regarding the program direction along with the information regarding the location of a verify target memory cell. Accordingly, the driving force adjustment circuit 200 of FIG. 2 may adjust the driving forces of the respective first and second verify pass voltages VP_1 and VP_2 based on the location of a verify target memory cell and the program direction.

The voltage generation circuit 220 may be a component for setting the driving forces of the plurality of verify pass voltages VP_1 and VP_2 based on the selection voltage information INF_VT. In other words, the voltage generation circuit 220 may set the driving forces of the first verify pass voltage VP_1 and the second verify pass voltage VP_2. The voltage generation circuit 220 may also generate the verify voltage V_SEL, which is to be applied to a word line, corresponding to a verify target memory cell. For reference, the selection voltage information INF_VT may be included in the voltage control signal CTR_V of FIG. 1.

The word line driving circuit 230 may be a component for driving the plurality of word lines WL1, . . . WLn by the plurality of verify pass voltages VP_1 and VP_2 based on the selection word line information INF_WL. Namely, the word line driving circuit 230 may drive unselected word lines by the first verify pass voltage VP_1 and the second verify pass voltage VP_2 based on the selection word line information INF_WL. Moreover, the word line driving circuit 230 may drive a selected word line by the verify voltage V_SEL based on the selection word line information INF_WL. For reference, the selection word line information INF_WL may be included in the driving address signal ADD_D of FIG. 1.

Through the above-described configuration, the semiconductor memory device in accordance with the embodiment of the present disclosure may adjust the driving forces of the respective first and second verify pass voltages VP_1 and VP_2 in the verify operation. Furthermore, the semiconductor memory device may adjust a verify operation period based on the driving forces of the respective first and second verify pass voltages VP_1 and VP_2.

Figure 5:
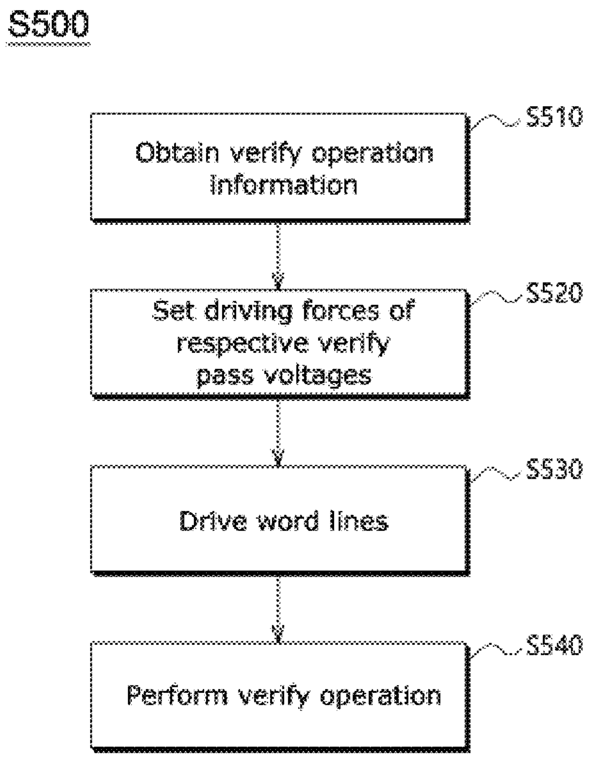
FIG. 5 is a flowchart explaining a method for operating the semiconductor memory device of FIGS. 1 to 4.

FIG. 5 is a flowchart explaining a method for operating the semiconductor memory device of FIGS. 1 to 4.

Referring to FIGS. 1 to 5, the method for operating the semiconductor memory device may include step S510 of obtaining the verify operation information INF_VF, step S520 of setting the driving forces of the plurality of respective verify pass voltages VP_1 and VP_2, step S530 of driving the plurality of word lines WL1, WL2, . . . WLn and step S540 of performing the verify operation.

The step S510 of obtaining the verify operation information INF_VF may be step for receiving and obtaining the verify operation information INF_VF. The step S510 of obtaining the verify operation information INF_VF may be performed by the verify control circuit 210 of FIG. 2. As described above, the verify control circuit 210 may obtain the verify operation information INF_VF, and through this, may control the overall verify operation.

The step S520 of setting the driving forces of the plurality of respective verify pass voltages VP_1 and VP_2 may be step for setting the driving forces of the plurality of respective verify pass voltages VP_1 and VP_2 based on the verify operation information INF_VF. The step S520 of setting the driving forces of the plurality of respective verify pass voltages VP_1 and VP_2 may be performed by the voltage generation circuit 220 of FIG. 2. As described above, the voltage generation circuit 220 may set the driving forces of the plurality of respective verify pass voltages VP_1 and VP_2 based on the selection voltage information INF_VT that corresponds to the verify operation information INF_VF. That is to say, the first verify pass voltage VP_1 and the second verify pass voltage VP_2 as the plurality of verify pass voltages VP_1 and VP_2 may be set as in case (A), case (B), and case (C) of FIG. 4 based on the verify operation information INF_VF.

The step S530 of driving the plurality of word lines WL1, WL2, . . . WLn may be step for driving unselected word lines, among the plurality of word lines WL1, WL2, . . . WLn by the plurality of verify pass voltages VP_1 and VP_2. Also, the step S530 of driving the plurality of word lines WL1, WL2, . . . WLn may be step for driving a selected word line, among the plurality of word lines WL1, WL2, . . . WLn, corresponding to a verify target memory cell by the verify voltage V_SEL. The step S530 of driving the plurality of word lines WL1, WL2, . . . WLn may be performed by the word line driving circuit 230 of FIG. 2. As described above, the word line driving circuit 230 may drive the selected word line by the verify voltage V_SEL based on the selection word line information INF_WL. Further, the word line driving circuit 230 may drive the unselected word lines by the plurality of respective verify pass voltages VP_1 and VP_2 based on the selection word line information INF_WL.

The step S540 of performing the verify operation may be step for performing the verify operation on the verify target memory cell. The step S540 of performing the verify operation may be performed by the plurality of page buffer circuits 2300 of FIG. 1. The plurality of page buffer circuits 2300 may perform the verify operation based on data that is provided from the memory cell array circuit 1000. As described above with reference to FIG. 4, the activation time points of the plurality of page buffer circuits 2300 may be different from one another.

The semiconductor memory device, in accordance with the embodiment of the present disclosure, may drive unselected word lines by the plurality of verify pass voltages VP_1 and VP_2. As a consequence, power that is consumed in the verify operation may be minimized, and a circuit operation time for the verify operation may be optimized.

As is apparent from the above description, according to the embodiments of the present disclosure, a circuit operation time for a verify operation of a semiconductor memory device may be optimized, and the power consumed in the verify operation may be minimized.

While various embodiments have been described above, it will be understood to those skilled in the art that the embodiments described are examples only. Accordingly, the semiconductor memory device and the operating method thereof described herein should not be limited based on the described embodiments.

What is claimed is:

1. A semiconductor memory device comprising:

a plurality of memory cells; and a driving force adjustment circuit configured to adjust, based on at least one of a number of memory cells in a programmed state among the plurality of memory cells and a number of memory cells in an erased state among the plurality of memory cells, time for at least one verify pass voltage to reach a corresponding target voltage level and configured to apply the at least one verify pass voltage to at least one memory cell among the plurality of memory cells.

2. The semiconductor memory device according to claim 1, wherein the at least one verify pass voltage includes a first verify pass voltage and a second verify pass voltage, and wherein the driving force adjustment circuit is configured to apply the first verify pass voltage to a word line coupled to a memory cell, among the plurality of memory cells, which is in the programmed state, and to apply the second verify pass voltage to a word line coupled to a memory cell, among the plurality of memory cells, which is in the erased state.

3. The semiconductor memory device according to claim 2, wherein a target voltage level of the first verify pass voltage is higher than a target voltage level of the second verify pass voltage.

4. The semiconductor memory device according to claim 1, further comprising:

a plurality of page buffer circuits configured to perform a verify operation by receiving data that is transferred from a target memory cell among the plurality of memory cells; and an operation control circuit configured to control an activation time point of the plurality of page buffer circuits in the verify operation, based on the adjusted time for the at least one verify pass voltage to reach the corresponding target voltage level.

5. The semiconductor memory device according to claim 1, wherein the driving force adjustment circuit comprises:

a verify control circuit configured to generate a selection voltage information and a selection word line information, based on the at least one of the number of memory cells in the programmed state and the number of memory cells in the erased state;

a voltage generation circuit configured to set the time for the at least one verify pass voltage based on the selection voltage information; and a word line driving circuit configured to drive at least one word line coupled to the at least one memory cell using the at least one verify pass voltage based on the selection word line information.

6. The semiconductor memory device according to claim 1, wherein the time for the at least one verify pass voltage to reach the corresponding target voltage level is adjusted to be longer as the number of memory cells in the programmed state increases.

7. A semiconductor memory device comprising:

a plurality of memory cells; and a driving force adjustment circuit configured to adjust, based on a location of a target memory cell among the plurality of memory cells and a program direction, time for at least one verify pass voltage to reach a corresponding target voltage level and configured to apply the at least one verify pass voltage to at least one memory cell other than the target memory cell among the plurality of memory cells.

8. The semiconductor memory device according to claim 7, wherein the at least one verify pass voltage includes a first verify pass voltage and a second verify pass voltage, and wherein the driving force adjustment circuit is configured to apply the first verify pass voltage to a word line coupled to a memory cell, among the plurality of memory cells, which is in a programmed state, and to apply the second verify pass voltage to a word line coupled to a memory cell, among the plurality of memory cells, which is in an erased state.

9. The semiconductor memory device according to claim 8, wherein a target voltage level of the first verify pass voltage is higher than a target voltage level of the second verify pass voltage.

10. The semiconductor memory device according to claim 7, further comprising:

a plurality of page buffer circuits configured to perform a verify operation by receiving data that is transferred from the target memory cell; and an operation control circuit configured to control an activation time point of the plurality of page buffer circuits in the verify operation based on the adjusted time for the at least one verify pass voltage to reach the corresponding target voltage level.

11. The semiconductor memory device according to claim 7, wherein the driving force adjustment circuit comprises:

a verify control circuit configured to generate a selection voltage information and a selection word line information, based on the location of the target memory cell and the program direction;

a voltage generation circuit configured to set the time for the at least one verify pass voltage based on the selection voltage information; and a word line driving circuit configured to drive at least one word line coupled to the at least one memory cell using the at least one verify pass voltage based on the selection word line information.

12. The semiconductor memory device according to claim 7, wherein the time for the at least one verify pass voltage to reach the corresponding target voltage level is adjusted to be longer as a number of memory cells in a programmed state increases.

13. A driving force adjustment circuit of a semiconductor memory device comprising:

a verify control circuit configured to generate selection voltage information and selection word line information based on at least one of a number of memory cells in a programmed state and a number of memory cells in an erased state;

a voltage generation circuit configured to set a driving force of at least one verify pass voltage based on the selection voltage information; and a word line driving circuit configured to drive at least one word line using the at least one verify pass voltage based on the selection word line information, wherein the at least one verify pass voltage reaches a corresponding target voltage level more quickly as the driving force increases.

14. The driving force adjustment circuit according to claim 13, wherein the at least one verify pass voltage includes a first verify pass voltage and a second verify pass voltage, and wherein the word line driving circuit is configured to apply the first verify pass voltage to a word line coupled to a memory cell in the programmed state, and to apply the second verify pass voltage to a word line coupled to a memory cell in the erased state.

15. The driving force adjustment circuit according to claim 14, wherein a target voltage level of the first verify pass voltage is higher than a target voltage level of the second verify pass voltage.

16. The driving force adjustment circuit according to claim 13, wherein the voltage generation circuit is configured to decrease the driving force as the number of memory cells in the programmed state increases.

* * * * *